United States Patent
Ballweber et al.

(10) Patent No.: US 6,889,036 B2
(45) Date of Patent: May 3, 2005

(54) INTEGRATED FREQUENCY SELECTABLE RESONANT COUPLING NETWORK AND METHOD THEREOF

(75) Inventors: Brian M. Ballweber, Austin, TX (US); Stephen W. Dow, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 454 days.

(21) Appl. No.: 10/092,932

(22) Filed: Mar. 7, 2002

(65) Prior Publication Data

US 2003/0171109 A1 Sep. 11, 2003

(51) Int. Cl.$^7$ .............................. H04B 1/18; H03J 3/20
(52) U.S. Cl. .................... 455/292; 455/287; 455/169.1; 455/191.2; 455/193.2; 455/323; 334/55
(58) Field of Search .................... 455/323, 340, 455/206, 287, 289, 290, 291, 292, 293, 161.1, 169.1, 169.2, 180.4, 191.1, 191.2, 191.3, 193.2; 334/55, 57, 58, 59, 60, 64, 78, 84; 333/175, 177

(56) References Cited

U.S. PATENT DOCUMENTS

| | | | |
|---|---|---|---|
| 3,022,477 A | | 2/1962 | Regnier |
| 3,824,599 A | | 7/1974 | Haswell ...................... 343/822 |
| 4,970,479 A | | 11/1990 | Landt et al. ................ 333/101 |
| 5,020,146 A | * | 5/1991 | Pugel ...................... 455/195.1 |
| 5,258,728 A | | 11/1993 | Taniyoshi et al. ........... 333/126 |
| 5,446,447 A | * | 8/1995 | Carney et al. ............ 340/572.4 |
| 5,644,598 A | * | 7/1997 | Bidese ....................... 375/258 |
| 5,715,531 A | * | 2/1998 | Liu et al. ..................... 455/307 |
| 5,834,975 A | * | 11/1998 | Bartlett et al. ............... 330/278 |
| 5,872,489 A | * | 2/1999 | Chang et al. ................ 331/179 |
| 6,026,286 A | * | 2/2000 | Long ........................... 455/327 |
| 6,157,822 A | * | 12/2000 | Bastani et al. .............. 455/323 |
| 6,181,218 B1 | * | 1/2001 | Clark et al. ............. 331/177 R |
| 6,549,096 B2 | * | 4/2003 | Groves et al. ............... 333/174 |

* cited by examiner

*Primary Examiner*—Duc M. Nguyen
(74) *Attorney, Agent, or Firm*—Charles W. Bethards

(57) ABSTRACT

An integrated center frequency selectable resonant coupling network suited for use in an integrated circuit is disclosed. The network includes an integrated coupling transformer having a secondary winding for coupling to a load and a primary winding for coupling to a source; a first integrated capacitive circuit controllably coupled across one of the primary and secondary windings and when so coupled operable to resonate with the integrated coupling transformer at a frequency in a first frequency band; and a second integrated capacitive circuit coupled across a second one of the primary and the secondary windings that is operable to resonate with the integrated coupling transformer at a frequency in a second frequency band. The method is in an IC and includes providing and coupling an input signal within alternatively a first frequency band and a second frequency band to a primary winding of an integrated coupling transformer; controlling an integrated switched capacitor network, coupled to the transformer, to provide a coupling network that is alternatively and respectively resonant at a first and second frequency within the first and second frequency band thus selectively providing an output signal at a secondary winding of the transformer; and down converting the output signal.

25 Claims, 3 Drawing Sheets

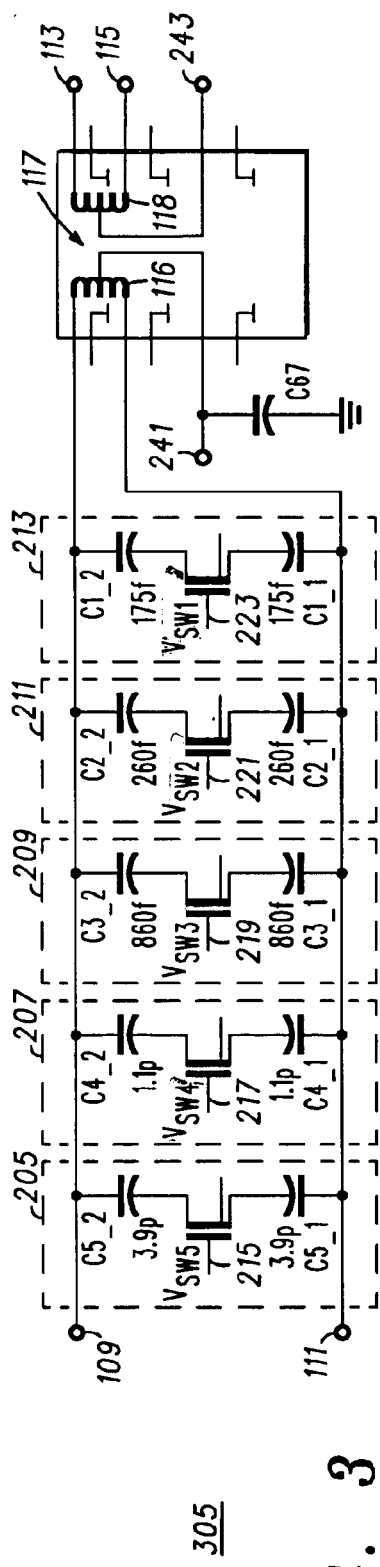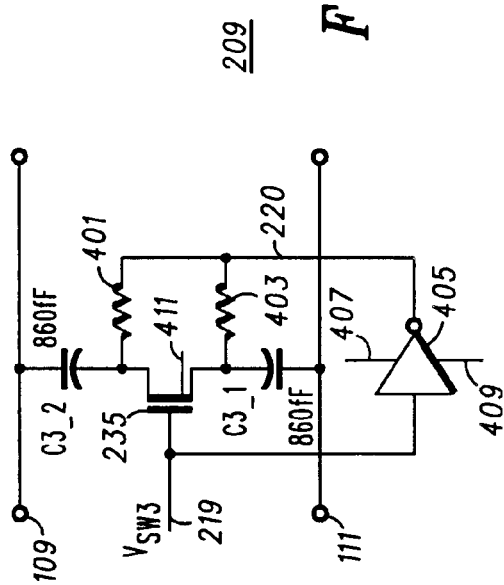
FIG. 3
FIG. 4

INTEGRATED FREQUENCY SELECTABLE RESONANT COUPLING NETWORK AND METHOD THEREOF

FIELD OF THE INVENTION

This invention relates in general to communication equipment and more specifically to a method, apparatus, and integrated circuit for frequency selectable coupling of signals within such equipment.

BACKGROUND OF THE INVENTION

Communications equipment and networks and methods of coupling signals therein are known. As this communications equipment has become smaller the desire for ever-smaller, more efficient, less complex, and less costly coupling networks and systems has grown. More recently more of this communications equipment has been tasked with operating in multiple frequency bands. For example cellular phones or devices or handsets now routinely operate in two or more distinct frequency bands, such as 800 or 900 MHz as well as 1.8 and above GHz.

It is known to provide multiple receiver front ends and multiple coupling networks to multiple mixers with each line up contributing its own frequency selectivity or filtering, however this is expensive in terms of cost and volume required within the equipment even when most or all of the respective components are integrated. One technique used for these multiple line ups includes a narrow band low noise amplifier transformer coupled to a mixer where the transformer is resonant with a capacitor for selectivity. It is known that resonating the transformer will provide filtering and using a varactor to tune this resonant frequency has been contemplated. However multiple lineups are required to cover multiple frequency bands.

Clearly a need exists for an integrated frequency selectable resonant coupling network and methods thereof suitable for use in integrated circuits adapted for communications equipment.

SUMMARY OF THE INVENTION

This invention concerns various aspects of an integrated center frequency selectable resonant coupling network, a radio frequency (RF) receiver front end integrated circuit (IC) that uses an embodiment of the coupling network and is arranged and constructed for receiving signals in a plurality of frequency bands, and a method in an integrated circuit for processing signals in a plurality of frequency bands.

The integrated center frequency selectable resonant coupling network aspect of the invention includes an integrated coupling transformer having a secondary winding for coupling to a load and a primary winding for coupling to a source; a first integrated capacitive circuit controllably coupled across a one of the primary and the secondary windings and when so coupled operable to resonate with the integrated coupling transformer at a frequency in a first frequency band; and a second integrated capacitive circuit coupled across a second one that may be the same one of the primary and the secondary windings and when so coupled operable to resonate with the integrated coupling transformer at a second frequency in a second frequency band.

The radio frequency (RF) receiver front end integrated circuit (IC) aspect of the invention is arranged and constructed for receiving signals in a plurality of frequency bands. The IC includes a low noise amplifier (LNA) for amplifying an input signal within the plurality of frequency bands; a center frequency selectable resonant coupling network that further includes an integrated coupling transformer having a primary winding coupled to said LNA and a secondary winding a first integrated capacitive circuit controllably coupled across a first one of the primary and the secondary winding and when so coupled operable to resonate with the integrated coupling transformer at a first frequency in a first one of the plurality of frequency bands; and a second integrated capacitive circuit coupled across a second one that may be the same as the first one of the primary and the secondary winding and when so coupled operable to resonate with the integrated coupling transformer at a second frequency in a second one of the plurality of frequency bands; and a radio frequency mixer for down converting an output signal at the secondary winding within either the first or the second of the plurality of frequency bands to a base-band signal.

The method in an integrated circuit for processing signals in a plurality of frequency bands aspect of the invention includes: providing an input signal within alternatively a first frequency band and a second frequency band; coupling the input signal to a primary winding of an integrated coupling transformer; controlling an integrated switched capacitor network that is coupled to the transformer to provide a coupling network that is alternatively and respectively resonant at a first frequency within the first frequency band and a second frequency within the second frequency band to selectively provide an output signal at a secondary winding of the transformer; and down converting the output signal.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 3 illustrates in a more detailed schematic of the FIG. 2 coupling network according to a preferred embodiment of the present invention;

FIG. 4 shows a detailed schematic of a control portion of the coupling network of FIG. 3.

DETAILED DESCRIPTION OF PREFERRED EMBODIMENT

In overview the present disclosure concerns methods and apparatus that enable communications equipment that provide services for users thereof. More particularly various inventive concepts and principles embodied in methods, apparatus, and integrated circuits (ICs) for frequency selectable coupling and processing of signals are discussed and disclosed. The communications equipment of particular interest are cellular devices or handsets or the like that must operate in multiple frequency bands and the frequency selectable coupling networks are advantageously used, for example, to individually couple signals within these multiple frequency bands to a common function. Such circumstances would be encountered, for example, in a cellular phone or handset that operates in the below 1 GHz cellular frequency band, for example GSM band between 925–960 MHz, but must also operate in the DCS and PCS frequency bands, respectively, 1.805–1.880 GHz and 1.930–1.990 GHz.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in various semiconductor circuits and processes. It is expected that one of ordinary skill, notwithstanding possibly significant effort and many design choices motivated by, for example, available time, current technology, and economic considerations, when guided by the concepts and principles disclosed herein will be readily capable of generating such circuits in accordance with the design rules of the appropriate semiconductor processes with minimal experimentation. Therefore further discussion of such circuits and processes, if any, will be limited to the essentials of the preferred embodiments all in the interest of brevity and minimization of any risk of obscuring the principles and concepts according to the present invention.

Figure 1:
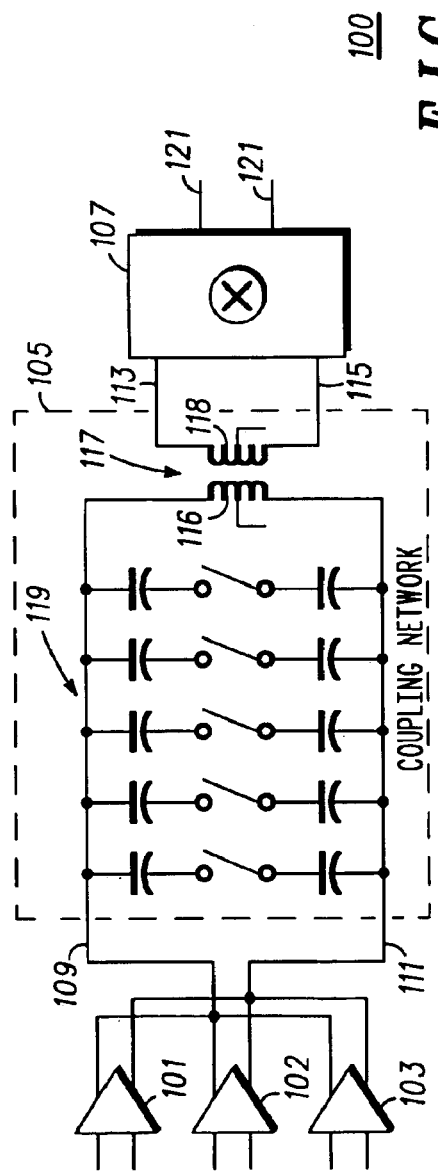
FIG. 1 depicts, in a representative form, a block diagram of a preferred embodiment of a radio frequency receiver integrated circuit according to the present invention.

FIG. 1 depicts, in a representative form, a block diagram of a preferred embodiment of a radio frequency receiver integrated circuit (IC) 100 according to the present invention. This IC is preferably fashioned in a high speed process, such as Silicon Germanium bipolar or CMOS process suitable for integrating RF receiver front-end circuitry. The process would also preferably have multiple metal interconnections layers (3 or more) capable of implementing a highly-symmetric transformer function and capacitors exhibiting low parasitics for implementing an efficient switched capacitor network, for example, MIM (metal-insulator-metal) capacitors. This IC 100 is preferably a radio frequency (RF) receiver front-end integrated circuit (IC) that is arranged and constructed in an inventive and advantageous manner for receiving signals in a plurality of frequency bands, such as the 800–975 MHz band and the 1.8 to 2.0 GHz frequency band. The IC includes a low noise amplifier (LNA) for amplifying an input signal within the plurality of frequency bands. Preferably a plurality (3 depicted) of LNAs 101, 102, 103 are each coupled to their respective feed circuits (generally known and not shown), such as, an antenna etc. and are optimized and operate, when enabled, to amplify signals within one of the plurality of frequency bands. These LNAs are relatively narrow band LNAs each for amplifying one of a plurality of signals, each, respectively, within one of the plurality of frequency bands.

In a preferred form this LNA or LNAs are known differential cascaded common-emitter LNAs. Theoretically any number of LNAs could be provided or included however, as one of ordinary skill will recognize, practical considerations such as number of IC I/O pins, circuit parasitics, layout complexity, and chip size may result in an upper limit.

The LNA or LNAs in parallel are coupled to a center frequency selectable resonant coupling network 105. The network 105 is further coupled to a radio frequency mixer 107. The LNAs preferably provide a differential signal at the inputs 109, 111 of the network. The radio frequency mixer 107 operates to convert an output signal from the network at 113, 115 that is within any one of the plurality of frequency bands to a base-band signal 121. While various forms of the mixer will operate, in the preferred embodiment this mixer is a known double balanced direct conversion mixer having a bandwidth of well over an octave. The mixer is further driven by a local oscillator signal (not shown) to provide the base-band signal at a frequency equal to the difference between the frequency of the output signal (input signal to the mixer) and local oscillator signal.

This network 105 includes an integrated coupling transformer 113 having a primary winding 116 coupled to the LNAs and a secondary winding 118, optionally including a fixed capacitor (nominally 75 fF and not explicitly shown) parallel coupled thereto, coupled to the mixer 107 and an integrated, preferably switched, capacitor network 119 that is controllably coupled, preferably using one or more integrated switches that are actively biased both on or shorted and off or open, across one or both of these windings to cause the transformer to resonate at various frequencies within the plurality of frequency bands. The capacitor or capacitive network is here depicted as a plurality of series coupled capacitors that can individually be switched in parallel with the primary winding. The specifics and additional particulars of the coupling network 105 as well as capacitor network 119 will be discussed in further detail herein below.

However, it will be clear that the RF receiver front end IC is preferably arranged to couple a differential signal from the LNA(s) to the radio frequency mixer thereby rejecting common mode signals. The integrated coupling transformer is advantageously used in the preferred form to provide an impedance transformation between the LNA and the radio frequency mixer, thereby improving a power match. This transformer is preferably implemented as a 6:2 transformer (3:1 ratio) where for every 6 turns on the primary there are 2 turns on the secondary winding. Thus the LNA that are relatively high impedance devices can be more closely power matched to the relatively lower impedance mixer. Furthermore by providing a center tap on the primary winding or on the secondary winding biasing for, respectively, the LNAs or mixer can be facilitated without requiring additional inductors or the like. In sum in the preferred form the RF receiver front end IC 100 is particularly suited and arranged and can be used for selectively and alternatively coupling, from one relatively narrow band LNA to the radio frequency mixer, as amplified by the LNAs, a first differential signal centered at a frequency that is less than 1 GHz and a second differential signal centered at a frequency that is greater than 1.8 GHz.

As a brief overview with a detailed discussion to follow, with reference to the additional figures, the IC 100 and coupling network 105, preferably, includes frequency band or coarse frequency changing as well as frequency tuning integrated capacitive circuits as part of the capacitor network 119. Included is a first integrated capacitive circuit controllably coupled, again preferably by an integrated switch that is actively biased on and off, across one of the primary winding or the secondary winding and when so coupled operable to resonate with the integrated coupling transformer at a first frequency; and a second integrated capacitive circuit coupled or controllably coupled across one of the primary winding or the secondary winding and when so coupled operable to resonate with said integrated coupling transformer at a second frequency. By coupling various combinations of the first and second integrated capacitive circuits across their respective windings the coupling network and integrated coupling transformer will be caused to resonate at frequencies within the plurality of frequency bands. These combinations can include neither or both or either of the first and second integrated capacitive circuits. The RF receiver front end IC 100 may further include one or more (3 depicted) integrated capacitive circuits controllably coupled across the primary winding or the secondary winding that when so coupled, effectively in parallel with one of the other, first and second, integrated capacitive circuits operate to fine tune or cause a more modest shift in, respectively, one of the frequencies where the transformer resonates.

These integrated capacitive circuits further include a control terminal for a control signal to control coupling of the integrated capacitive circuits across their respective, primary or secondary winding. Each of these integrated capacitive circuits further include, respectively, a switch and corresponding capacitors that are carefully arranged to present a balanced differential load to a differential signal provided by the LNA or other differential signal source when the integrated capacitive circuit is coupled across its respective winding as well as when the capacitive circuit is not so coupled. In the preferred form these integrated capacitive circuits each include, coupled across their respective primary or secondary a series circuit that includes a first capacitor in series with an integrated switch, preferably actively biased on or off, that is further in series with a second capacitor, where the first capacitor and the second capacitor are arranged to be of equal value. The control terminal, not shown in FIG. 1 is operable to open or short the integrated switch. With this symmetrical circuit an actual layout of an IC can be organized such that differential loads presented to the differential signal are very closely matched even with respect to various parasitics.

Figure 2:
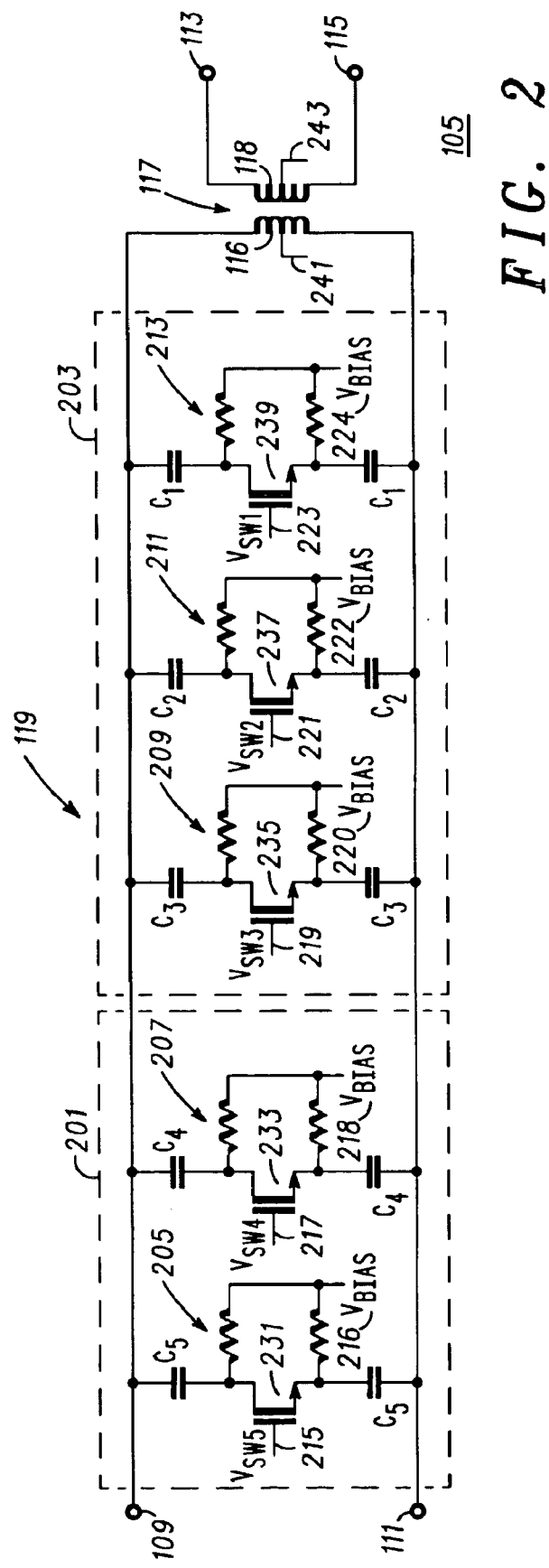
FIG. 2 depicts, in a simplified schematic form, a preferred embodiment of an integrated frequency selectable resonant coupling network that is suitable for use in the FIG. 1 block diagram and in accordance with the present invention.

The following description is provided with reference to the FIG. 2 depiction, of a simplified schematic of a preferred embodiment of an integrated frequency selectable resonant coupling network 105 that is suitable for use in the FIG. 1 block diagram. Elements in FIG. 2 that are identical or similar to the same elements in FIG. 1 are identified with like reference numerals, Thus the overall network 105, the integrated coupling transformer 117 having a primary winding 116 for coupling to a source or signal, such as the LNA of FIG. 1, at inputs 109, 111 and a secondary winding 118, optionally including a fixed capacitor (not shown) parallel coupled thereto, suitable for coupling to a load, such as the radio frequency mixer of FIG. 1 at outputs 113, 115, and the integrated capacitive circuit 119 are shown.

Further included in the integrated frequency selectable resonant coupling network 105 and more specifically the integrated capacitor or capacitive network 119 is a plurality (2 shown) of frequency band changing integrated capacitive circuits 201 as well as a plurality (3 shown) of frequency tuning integrated capacitive circuits 203. The band changing integrated capacitive circuits 201 includes a first integrated capacitive circuit 205 that is switched or controllably coupled across or in parallel with one of the primary winding and the secondary winding (depicted across primary). When this integrated circuit is so coupled it will operate and be operable to resonate with the integrated coupling transformer at a first frequency, preferably, in or within one of the plurality of frequency bands. Additionally included in the band changing integrated capacitive circuits 201 is a second integrated capacitive circuit 207 that is coupled and, preferably, switched or controllably coupled across one of the primary winding and the secondary winding and when so coupled operable to resonate with the integrated coupling transformer at a second frequency in a second one of the plurality of frequency bands. Note that additional band changing integrated capacitive circuits can be included if and as required to cover additional bands and band-width.

Additionally the integrated center frequency selectable resonant coupling network 105 includes one or more (3 depicted) frequency tuning integrated capacitive circuits 209, 211, 213 controllably coupled or switched across the primary winding as depicted or alternatively the secondary winding and when so coupled across one of the primary or the secondary windings, effectively in parallel with the first integrated capacitive circuit 205 and the second integrated capacitive circuit 207, operable to fine tune, respectively, one of the first and the second frequencies of resonance. Each of the first, second, etc. integrated capacitive circuits 205–213 include, respective, control terminals 215–223 for application of a control signal in order to control coupling of the integrated capacitive circuits, respectively, across the primary winding or the secondary winding. In the preferred form this control terminal is the gate lead of an NMOS transistor or switch. Further each of the integrated capacitive circuits includes a bias lead, respectively, 216–224 that is coupled to both the source and drain terminal of the NMOS device through large value (on the order of 20K to 100K ohm) resistors. This bias technique will be further discussed below with reference to FIGS. 3 and 4.

More specifically each of the integrated capacitive circuits further include, respectively, a switch 231–239 and corresponding capacitors C5, C4, C3, C2, C1 that are arranged to present a balanced differential load to a differential signal provided by the source or LNA when the integrated capacitive circuit is coupled across the primary winding or the secondary winding as well as when the integrated capacitive circuit is not coupled across the primary winding or the secondary winding. In particular in the preferred form the integrated capacitive circuits each include, coupled across the, respective primary or secondary winding, a series circuit that includes, respectively, a first capacitor C5–C1 in series with the integrated switch 231–239 that is further in series with a second capacitor C5–C1, where the first capacitor and the second capacitor are arranged to be of equal value all as depicted. In the preferred circuit the capacitors have nominal values of C5=3.9pF (pico-Farad), C4=1.1pF, C3=0.86pF, C4=0.26pF, and C1=0.175pF. In the preferred NMOS form when the control or gate terminal is bought to a high potential the bias lead will be brought to a low potential thus operating to short the integrated switch so the two capacitors are coupled together in series with or through a low impedance path. When the control or gate terminal is brought to a low potential and the bias lead to a high voltage the integrated switch becomes essentially an open circuit having an impedance approximated by the large value resistor in series with each capacitor to a common potential or ground. Collectively this operates to present a balanced differential load including parasitic loads to the differential signal regardless of whether the switch is open or shorted. As a practical matter the integrated switches will need to be designed for reasonably low impedances relative to the capacitors they are coupling or shorting together.

The integrated center frequency selectable resonant coupling network 105 as above noted includes the integrated coupling transformer 117 and this preferably includes a center tap 241 on the primary winding and a center tap 243 on the secondary winding, where these center taps can facilitate biasing by providing a path for a DC bias current for, respectively, one of the source or LNAs and the load or mixer. As earlier noted by varying the turns ratio of the integrated coupling transformer it may be arranged to provide an impedance transformation between the source and the load, thereby improving a power match between the source and the load. The integrated center frequency selectable resonant coupling network 105 and constituent elements thereof is especially suited for frequency selective coupling a differential signal from the source to the load. In the preferred form the integrated center frequency selectable resonant coupling network 105 is arranged for selectively and alternatively coupling, from the source to the load, a first differential signal centered at a frequency that is less than 1 GHz and a second differential signal centered at a frequency that is greater than 1.8 GHz.

The reader will note that the integrated capacitive circuits have all been depicted as controllably coupled across the primary winding of the integrated coupling transformer. This is the approach used in the preferred embodiment where the primary side of the transformer is relatively high impedance since the source or LNA used is relatively high impedance and the secondary side is relatively low impedance since the load or radio frequency mixer is relatively low impedance. By including the integrated capacitors on the higher impedance side of the transformer the capacitors can be relatively smaller thereby saving space, particularly given the large number of capacitors. Further more the integrated switches do not have to be as low in impedance as they would if the capacitors were larger and thus lower in impedance at the frequencies of interest as would be the case on the secondary side of the transformer. On the other hand operating voltages will be higher on the higher impedance side of the resonant circuit. If for practical reasons, such as operating voltage constraints, layout convenience or otherwise or if the mixer utilized was higher impedance than the source, one or more or all of the integrated capacitive circuits could be placed on the secondary side of the transformer. Additionally while all of the integrated capacitive circuits have been shown with a switch for coupling (or not coupling) the circuit to the primary winding, at least one of them such as the aforementioned optional fixed capacitor could always be coupled across one of the windings. In this instance a capacitor that was the minimum value ever anticipated would be hard coupled to the relevant winding and the controllable integrated capacitive circuits would be activated or switched on to add capacitance and thus lower the frequency at which the transformer would resonate as desired. Also note that any or all or any combination of the controllable integrated capacitive circuits may be coupled to their respective windings at any one time and if the values of the capacitors are judiciously chosen as here the resultant integrated frequency selectable network will be tunable throughout an extensive, octave plus, frequency range.

Referring now to FIG. 3 a more detailed schematic of an integrated center frequency selectable resonant coupling network 305 is depicted and will now be described. Like or similar elements from FIG. 2 are identified by like reference numerals. The integrated capacitive circuits 205–213 are depicted in representative form with some layout information as well as the nominal values for C5–C1. The center tap 241 for the primary winding 116 is shown coupled to a supply voltage while the center tap 243 of the secondary winding 118 is made available for coupling to a mixer ground.

Referring to FIG. 4 the integrated capacitive circuit 209 is shown in further detail. Please note that this circuit is analogous for each of the other integrated capacitive circuits 205, 207, 209, and 211. The capacitive circuit 209 includes C3_2 (nominally 869 femto-Farads) in series with integrated switch 235 (preferably an NMOS transistor) further in series with C3_1 that is nominally equal to C3_2 all coupled across the primary winding of the transformer or specifically the input leads 109, 111. The integrated switch has a control terminal 219 connected to the gate lead of the switch. The drain and source leads of the integrated switch have resistors 401, 403 (nominally 20 to 100K ohms but closely matched) respectively coupled thereto and together to the bias lead 220. The integrated switch is actively biased on or off as follow. The control signal at the control terminal 219 is coupled to an inverter 405. Whenever the control signal goes high shorting or turning on the integrated switch the inverter output will go to ground 409 thus pulling the common terminal of the resistors to ground as well as the source and drain through the large value resistors. This will insure that the integrated switch is fully turned on and remains so regardless of the differential signal that may be applied. Conversely when the control terminal goes low the inverter output will go high or to the supply voltage 407 and apply a high voltage to the drain and source again assuring the switch remains off or in a high impedance state regardless of the differential signal that is applied at the input leads.

Figure 5:
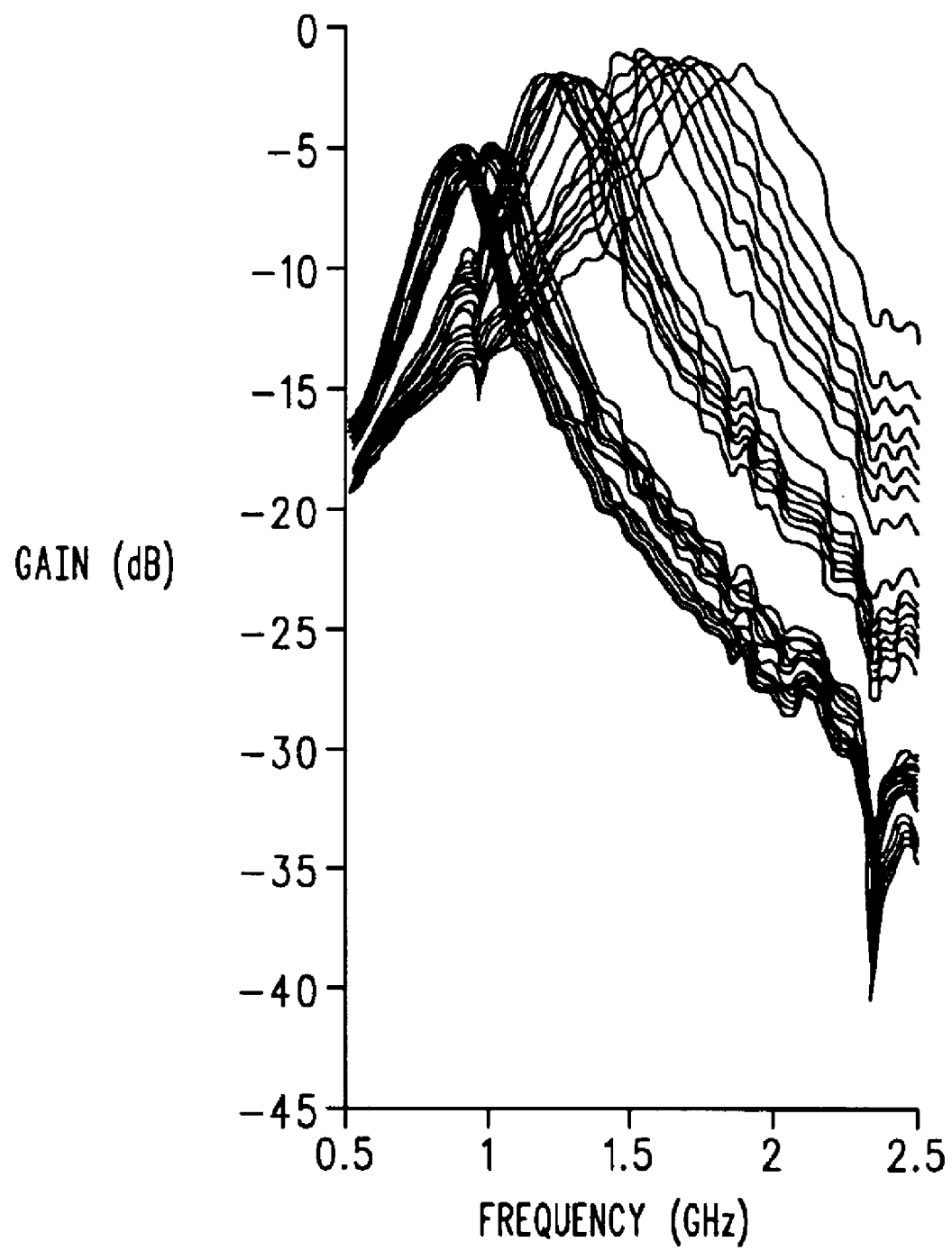
FIG. 5 depicts a representative performance graph of an experimental version of the FIG. 3 coupling network.

Referring to FIG. 5, a representative performance graph of an experimental version of the FIG. 3 coupling network is shown and will be briefly discussed. FIG. 4 is a plot showing the gain of the integrated center frequency selectable resonant coupling network versus frequency with different combinations of the integrated capacitive circuits enabled or shorted across the primary winding of the integrated coupling transformer. Higher loss is observed at lower frequencies due to the small size of the integrated transformer and thus low coupling at those frequencies, however this gain droop or drop can be compensated for in surrounding circuitry such as the gain of the source or LNA or load or mixer. You will also note the large frequency range from below 800 MHz to nearly 2 GHz that is covered by the coupling network, thus validating the practical nature of the coupling circuit in using multiple LNAs but only one mixer. This is important as radio frequency mixers, because of the dynamic range they must cover and extreme linearity requirements, as known are non-trivial circuits to implement in an integrated manner.

As a brief review a preferred method embodiment according to the present invention will be described. Basically this method is preferably implemented in the above described coupling network or RF IC. The method in an integrated circuit is for processing signals in a plurality of frequency bands and includes providing an input signal within alternatively a first frequency band and a second frequency band; coupling the input signal to a primary winding of an integrated coupling transformer; controlling an integrated switched capacitor network that is coupled to the transformer to provide a coupling network that is alternatively and respectively resonant at a first frequency within the first frequency band and a second frequency within the second frequency band to selectively provide an output signal at a secondary winding, optionally including a fixed capacitor parallel coupled thereto, of the integrated coupling transformer; and down converting the output signal to base band.

Preferably the step of providing includes providing a differential input signal and the step of controlling includes controlling an integrated switched capacitor network that at all times and in all states presents a balanced load to the differential input signal within the first frequency band and within the second frequency band. Controlling the capacitive network further includes controlling one or more integrated switched capacitor networks or circuits that each, preferably includes a series circuit including a first fixed and integrated capacitor coupled to a controllable integrated switch and further coupled to a second fixed integrated capacitor that is arranged to be equal to the first capacitor. The series circuit is coupled across one of the primary winding or the secondary winding. Controlling the controllable integrated switch to be one of a high impedance circuit and a low impedance circuit causes the coupling network to be alternatively resonant at the first frequency and the second frequency.

The processes and apparatus discussed above, and the inventive principles thereof are intended to and will alleviate problems caused by or resulting from prior art coupling networks where by different signals from multiple frequency bands were received by multiple radio frequency line ups. Using the integrated frequency selectable resonant coupling network discussed and disclosed herein provides a number of advantages. For example the coupling network and surrounding functionality is entirely integrated in IC form. By selectively resonating the coupling network by switching capacitive circuits across a coupling transformer, frequency selectable operation is achieved over an octave or more in frequency range and the band pass nature of the structure is advantageously used for rejection of far out spurious signals. The preferred differential form improves rejection of common mode signals and the transformer allows for an impedance transformation if needed, DC level shift when needed, and facilitates biasing of source and load functions with the center tap arrangement. Using these principles and benefits of this coupling arrangement will simplify and lower costs for communications equipment thus facilitating connectivity for mobile individuals.

Various embodiments of methods, integrated circuits, and coupling apparatus for selectively coupling a plurality of narrow band signals to a common wider band function so as to facilitate and provide for signal processing in an efficient and cost effective manner have been discussed and described. It is expected that these embodiments or others in accordance with the present invention will have application to communications equipment for wide area communications networks that provide for mobility of their user or subscriber devices or units as well as wireless local area networks that are coupled to fixed WANS such as the PSTN or internet. Using the inventive principles and concepts disclosed herein advantageously allows or provides for low current drain and low part count communications equipment which will be beneficial to users and service providers a like.

This disclosure is intended to explain how to fashion and use various embodiments in accordance with the invention rather than to limit the true, intended, and fair scope and spirit thereof. The invention is defined solely by the appended claims, as may be amended during the pendency of this application for patent, and all equivalents thereof.

What is claimed is:

1. An integrated center frequency selectable resonant coupling network comprising in combination:
   an integrated coupling transformer having a secondary winding including a fixed capacitor parallel coupled thereto for coupling to a load and a primary winding for coupling to a source;
   a first integrated capacitive circuit controllably coupled, by an integrated switch that is actively biased on or off, across a first one of said primary winding and said secondary winding and when so coupled operable to resonate with said integrated coupling transformer at a first frequency in a first frequency band, said first integrated capacitive circuit arranged to present a balanced differential load to a differential signal provided by said source when said integrated switch is biased on or off; and
   a second integrated capacitive circuit controllably coupled across a second one of said primary winding and said secondary winding and when so coupled operable to resonate with said integrated coupling transformer at a second frequency in a second frequency band.

2. The integrated center frequency selectable resonant coupling network of claim 1 wherein said integrated coupling transformer further includes a center tap on one of said secondary winding and said primary winding, said center tap facilitating biasing for, respectively, one of said load and said source.

3. The integrated center frequency selectable resonant coupling network of claim 1 wherein said integrated coupling transformer is further arranged to provide an impedance transformation between said source and said load, thereby improving a power match between said source and said load.

4. The integrated center frequency selectable resonant coupling network of claim 1 further arranged to couple a differential signal from said source to said load.

5. The integrated center frequency selectable resonant coupling network of claim 1 further including a third integrated capacitive circuit controllably coupled across said first one of said primary winding and said secondary winding and when so coupled across said first one of said primary winding and said secondary winding, effectively in parallel with one of said first integrated capacitive circuit and said second integrated capacitive circuit, operable to fine tune, respectively, one of said first frequency and said second frequency.

6. The integrated center frequency selectable resonant coupling network of claim 1 wherein said first integrated capacitive circuit and said second integrated capacitive circuit further include, respectively a first control terminal and a second control terminal for a first control signal and a second control signal to control coupling of said first integrated capacitive circuit and said second integrated capacitive circuit, respectively, across said first and said second one of said primary winding and said secondary winding.

7. The integrated center frequency selectable resonant coupling network of claim 1 wherein said first integrated capacitive circuit and said second integrated capacitive circuit further include, respectively, said integrated switch and corresponding capacitors and a second switch and corresponding capacitors that are arranged to present a balanced differential load to said differential signal provided by said source when one of said first integrated capacitive circuit and said second integrated capacitive circuit is coupled across said first one and said second one of said primary winding and said secondary winding and when one of said first integrated capacitive circuit and said second integrated capacitive circuit is not coupled across said first one and said second one of said primary winding and said secondary winding.

8. The integrated center frequency selectable resonant coupling network of claim 1 wherein said first integrated capacitive circuit includes, coupled across said first one of said primary winding and said secondary winding, a series circuit that includes a first capacitor in series with said integrated switch that is further in series with a second capacitor, said first capacitor and said second capacitor arranged to be of equal value.

9. The integrated center frequency selectable resonant coupling network of claim 8 further including a control terminal operable to open or short said integrated switch.

10. The integrated center frequency selectable resonant coupling network of claim 1 arranged for selectively and alternatively coupling, from said source to said load, a first differential signal centered at a frequency that is less than 1 GHz and a second differential signal centered at a frequency that is greater than 1.8 GHz.

11. A radio frequency (RF) receiver front end integrated circuit (IC) arranged and constructed for receiving signals in a plurality of frequency bands, the IC comprising in combination:
a low noise amplifier (LNA) for amplifying an input signal within the plurality of frequency bands;
a center frequency selectable resonant coupling network comprising in combination;
an integrated coupling transformer having a primary winding coupled to said LNA and a secondary winding including a fixed capacitor parallel coupled thereto;
a first integrated capacitive circuit controllably coupled, by an integrated switch that is actively biased on or off, across a first one of said primary winding and said secondary winding and when so coupled operable to resonate with said integrated coupling transformer at a first frequency, said first integrated capacitive circuit arranged to present a balanced differential load to a differential signal provided by said LNA when said integrated switch is biased on or off;
a second integrated capacitive circuit controllably coupled across a second one of said primary winding and said secondary winding and when so coupled operable to resonate with said integrated coupling transformer at a second frequency and wherein controllably coupling a combination of said first integrated capacitive circuit and said second integrated capacitive circuit will resonate said integrated coupling transformer at a frequency in one of the plurality of frequency bands; and
a radio frequency mixer for down converting an output signal at said secondary winding within either one of said first one of the plurality of frequency bands and a second one of the plurality of frequency bands to a base-band signal.

12. The RF receiver front cod IC of claim 11 wherein said integrated coupling transformer further includes a center tap on one of said secondary winding and said primary winding, said center tap facilitating biasing for, respectively, one of said LNA and said radio frequency mixer.

13. The RF receiver from end IC of claim 11 wherein said integrated coupling transformer is further arranged to provide an impedance transformation between said LNA and said radio frequency mixer, thereby improving a power match.

14. The RF receiver front end IC of claim 11 further arranged to couple a differential signal from said LNA to said radio frequency mixer.

15. The RF receiver front end IC of claim 11 further including a third integrated capacitive circuit controllably coupled across said first one of said primary winding and said secondary winding and when so coupled, effectively in parallel with one of said first integrated capacitive circuit and said second integrated capacitive circuit, operable to fine tune, respectively, one of said first frequency and said second frequency.

16. The RF receiver front end IC of claim 11 wherein said first integrated capacitive circuit and said second integrated capacitive circuit further include, respectively a first control terminal and a second control terminal for a first control signal and a second control signal to control coupling of said first integrated capacitive circuit and said second integrated capacitive circuit across said primary winding.

17. The RF receiver front end IC of claim 11 wherein said first integrated capacitive circuit and said second integrated capacitive circuit further include, respectively, said integrated switch and corresponding capacitors and a second switch and corresponding capacitors that arc arranged to present a balanced differential load to said differential signal provided by said LNA when one of said first integrated capacitive circuit and said second integrated capacitive circuit is coupled across said first one and said second one of said primary winding and said secondary winding and when said one of said first integrated capacitive circuit and said second integrated capacitive circuit is not coupled across said first one and said second one of said primary winding and said secondary winding.

18. The RF receiver front end IC of claim 11 wherein said first integrated capacitive circuit includes, coupled across said first one and said second one of said primary winding and said secondary winding, a series circuit that includes a first capacitor in series with integrated switch that is further in series with a second capacitor, said first capacitor and said second capacitor arranged to be of equal value.

19. The RF receiver front end IC of claim 18 further including a control terminal operable to open or short said integrated switch.

20. The RF receiver front end IC of claim 11 arranged for selectively and alternatively coupling, from said LNA to said radio frequency mixer, a first differential signal centered at a frequency that is less than 1 GHz and a second differential signal centered at a frequency that is greater than 1.8 GHz.

21. The RF receiver front end IC of claim 11 wherein said LNA further includes a plurality of narrow band LNAs each for amplifying one of a plurality of signals, each, respectively, within one of the plurality of frequency bands.

22. The RF receiver front end IC of claim 11 wherein said radio frequency mixer is a broadband double balanced direct conversion mixer.

23. A method in an integrated circuit for processing signals in a plurality of frequency bends, the method including the steps of:
providing an input signal within alternatively a first frequency band and a second frequency band, said input signal further comprising a differential input signal;
coupling said input signal to a primary winding of an integrated coupling transformer;
controlling, using an integrated switch that is actively biased on or off, an integrated switched capacitor network that presents a balanced load to said differential input signal and that is coupled to said transformer to provide a coupling network that is alternatively arid respectively resonant with said integrated coupling transformer at a first frequency within said first frequency band and a second frequency within said second frequency band to selectively provide an output signal at a secondary winding including a fixed capacitor, parallel coupled thereto, of said transformer; and down converting said output signal.

24. The method of claim 23 wherein said step of controlling further includes controlling said integrated switched capacitor network that presents said balanced load to said differential input signal within said first frequency band and within said second frequency band.

25. The method of claim 24 wherein said step of controlling further includes controlling an integrated switched capacitor network that includes a series circuit including a first fixed capacitor coupled to a controllable integrated switch coupled to a second fixed capacitor that is arranged to be equal to said first fixed capacitor, said series circuit coupled across one of said primary winding and said secondary winding, wherein controlling said controllable integrated switch to be one of a high impedance circuit and a low impedance circuit is included in causing said coupling network to be alternatively resonant at said first frequency and said second frequency.

* * * * *

UNITED STATES PATENT AND TRADEMARK OFFICE
CERTIFICATE OF CORRECTION

PATENT NO. : 6,889,036 B2
DATED : May 3, 2005
INVENTOR(S) : Ballweber et al.

It is certified that error appears in the above-identified patent and that said Letters Patent is hereby corrected as shown below:

<u>Column 11,</u>
Line 58, please delete "cod" and insert -- end --
Line 63, please delete "from" and insert -- front --

<u>Column 12,</u>
Line 37, please insert -- said -- after the word "with"
Line 57, please delete "bends" and insert -- bands --

Signed and Sealed this

Ninth Day of August, 2005

JON W. DUDAS
*Director of the United States Patent and Trademark Office*